(12) United States Patent
Hosokawa

(10) Patent No.: US 6,555,818 B1
(45) Date of Patent: Apr. 29, 2003

(54) TRANSMISSION ELECTRON MICROSCOPE

(75) Inventor: Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 124 days.

(21) Appl. No.: 09/595,870

(22) Filed: Jun. 16, 2000

(30) Foreign Application Priority Data

Jun. 16, 1999 (JP) .......................................... 11-169791
Jun. 16, 1999 (JP) .......................................... 11-169792

(51) Int. Cl.⁷ .............................................. H01J 37/10
(52) U.S. Cl. ................... 250/311; 250/396 R; 250/306; 250/398
(58) Field of Search ................................ 250/310, 311, 250/396 R, 306, 396 ML, 398

(56) References Cited

U.S. PATENT DOCUMENTS

| | | | |
|---|---|---|---|
| 4,962,313 A | * | 10/1990 | Rose ........................... 250/311 |
| 5,084,622 A | * | 1/1992 | Rose ........................ 250/396 R |
| 5,319,207 A | * | 6/1994 | Rose et al. ............. 250/396 R |
| 6,191,423 B1 | * | 2/2001 | Krijn et al. ............. 250/396 R |

OTHER PUBLICATIONS

"Sphärische und chromatische Korrektur von Elektronen-Linsen", Von O. Scherzer, *Optik 2*, pp. 114–132 (1947).
"Correction of the spherical aberration of a 200 kV TEM by means of a Hexapole–corrector", M. Haider et al., *Optik 99*, pp. 167–179 (1995).

* cited by examiner

*Primary Examiner*—John R. Lee
*Assistant Examiner*—David A. Vanore
(74) *Attorney, Agent, or Firm*—Webb Ziesenheim Logsdon Orkin & Hanson, P.C.

(57) ABSTRACT

There is disclosed a transmission electron microscope that uses an accelerating voltage on the order of 200 kV but is capable of correcting spherical aberration. This microscope has an illumination lens and an auxiliary illumination lens that are interlocked to form an electron diffraction image of a specimen at a fixed position independent of the current density on the specimen. A first hexapole element is mounted at the position where the electron diffraction image is formed. A second hexapole element is placed in a position conjugate with the first hexapole element. A doublet lens is disposed between these two hexapole elements.

4 Claims, 10 Drawing Sheets

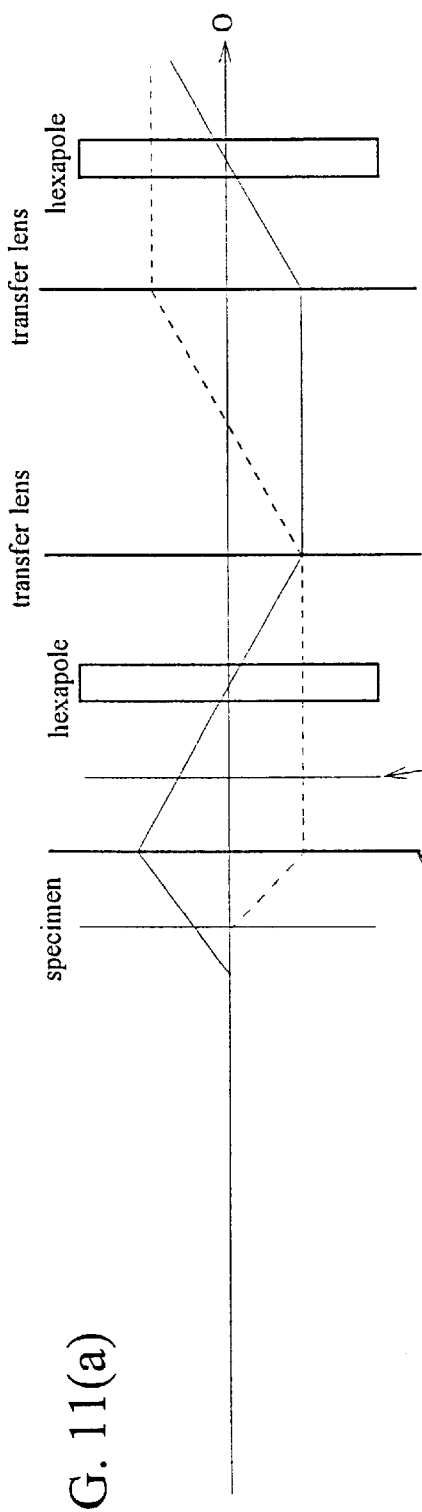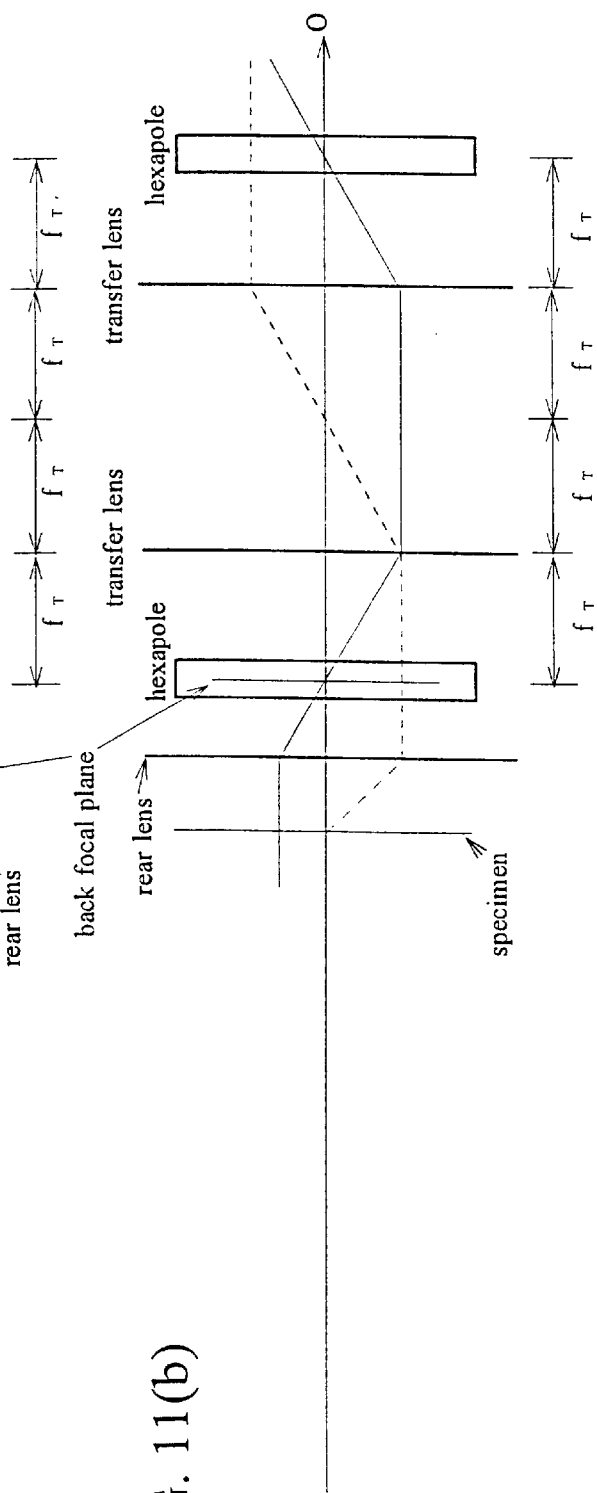
FIG. 11(a)
FIG. 11(b)

TRANSMISSION ELECTRON MICROSCOPE

BACKGROUND OF THE INVENTION

1. Field of the Invention

The present invention relates to a transmission electron microscope and, more particularly, to an optical system for correcting spherical aberration due to the objective lens.

2. Description of the Related Art

In transmission electron spectroscopy (TEM), it is desired to minimize the value of resolution d. For example, where the atomic arrangement of crystals or the like is directly visualized by TEM, the resolution d is required to be as high as about 0.1 nm.

The resolution d of a transmission electron microscope (TEM) is determined by the spherical aberration coefficient Cs of the objective lens as given by $$d = 0.65\, C_s^{\frac{1}{4}} \lambda^{\frac{3}{4}} \tag{1}$$

where $\lambda$ is the wavelength of electrons used. Therefore, it can be seen from Eq. (1) that the resolution d of the TEM can be reduced either by shortening the wavelength of the electrons or by reducing the spherical aberration coefficient Cs.

However, the polepieces of today's TEMs are optimized almost to the machining limit. Consequently, it is very difficult to reduce the spherical aberration coefficient Cs further.

On the other hand, it is relatively easy to increase the accelerating voltage. As mentioned above, the wavelength $\lambda$ of the electrons can be shortened by increasing the accelerating voltage. Thus, the resolution d can be reduced. In practice, a TEM with an accelerating voltage of 1000 kV can provide a resolution of about 0.1 nm. However, increasing the accelerating voltage increases the size of the instrument.

Accordingly, relatively small-sized TEMs with accelerating voltages on the order of 200 kV are required to exhibit resolutions of approximately 0.1 nm. In this class of TEM, $\lambda=0.00251$ nm and Cs=0.5 mm. Therefore, the present situation is that the resolution d is limited to about 0.19 nm.

As described thus far, the polepieces of TEMs have been optimized nearly to the machining limit. Accordingly, where one attempts to obtain a resolution of about 0.1 nm, the accelerating voltage must be increased. Therefore, the present situation requires that the instrument is made bulky.

If conventional polepieces are used, and if spherical aberration can be corrected even at an accelerating voltage of about 200 kV, the resolution can be improved. However, a TEM using a cylindrically symmetric round magnetic lens cannot correct spherical aberration. The round lens is so designed that the geometrical arrangement of lens properties is not affected by rotation of the lens about the optical axis. This is referred to as "axial symmetry".

That is, a round magnetic lens is normally used as an objective lens for a TEM. Unfortunately, the round magnetic lens cannot form a concave lens. Therefore, spherical aberration cannot be corrected by any combination of round magnetic lenses.

Accordingly, introduction of a magnetic field produced by multipole elements has been proposed to correct spherical aberrations (e.g., O. Scherzer, *Optik* 2 (1947), p. 114). This makes use of the fact that where hexapole elements, for example, are used as multipole elements, an aberration term of the intrinsic trajectory given to the electron by the hexapole elements appears as an effect that corrects the spherical aberration coefficient Cs of the objective lens. In particular, a combination of two transfer doublet lenses and two hexapole elements has been proposed to correct spherical aberrations (M. Haider, G. Braushausen, and E. Schwan, *Optik* 99 (1995), p. 167). One example of a post-specimen imaging optical system is shown in FIG. 10.

However, the optical system consisting of a combination of two transfer doublet lenses and two hexapole elements as shown in FIG. 10 is complex in structure. In addition, the microscope column is elongated, making the instrument large. The reason why the instrument is made large is summarized as follows. One transfer doublet lens is made up of two transfer lenses. Let $f_T$ be the focal distance of each doublet lens (i.e., the focal distance of the transfer lens). To accommodate this one doublet lens made up of two transfer lenses, a space as long as $4f_T$ is necessary in the microscope column. Therefore, assuming that the two doublet lenses have a focal length of $f_T$, a space having a length of $8f_T$ is necessary to accommodate these two doublet lenses. Since the focal lengths $f_T$ of the doublet lenses are approximately 30 to 50 mm, a length of 24 cm is needed in the microscope column only if two doublet lenses are accommodated, provided that $f_T$ is 30 mm.

SUMMARY OF THE INVENTION

Accordingly, it is an object of the present invention to provide a transmission electron microscope which is capable of correcting spherical aberration even if an accelerating voltage of about 200 kV is used and which has a microscope column that can be made shorter than that of the prior art instrument described-above.

The object described above is achieved by a transmission electron microscope which is built in accordance with the present invention and comprises: an illumination system including two illumination lenses interlocked in such a way as to form an image of a light source at a fixed first crossover point that is in immediate vicinity to a specimen upstream thereof; an objective lens; a first multipole element for producing a three-fold symmetrical field, the first multipole element being placed at a position where the objective lens forms the first crossover point as a second crossover point that is in immediate vicinity to the specimen downstream thereof; a second multipole element for producing a three-fold symmetrical field, the second multipole element being located downstream of the first multipole element; and a doublet lens located between the first and second multipole elements to project the second crossover point as a third crossover point onto the position of the second multipole element.

The present invention also provides a transmission electron microscope comprising: an objective lens for forming an electron diffraction image of a specimen; an illumination optical system for fixing the electron diffraction image at a position; a first multipole element for producing a three-fold symmetrical field, the first multipole element being at the position where the electron diffraction image is formed; a second multipole element for forming a three-fold symmetrical field, the second multipole element being located in a position conjugate with the first multipole element; and a doublet lens located between the first and second multipole elements to project an electron diffraction image formed at the position of the first multipole element onto the position of the second multipole element.

More specifically, the present invention provides a transmission electron microscope comprising:

an objective lens for forming an electron diffraction image of a specimen; an illumination optical system for fixing the electron diffraction image at a position independent of a current density on a specimen; a first multipole element for producing a three-fold symmetrical magnetic field having a center where the electron diffraction image is formed; a second multipole element for producing a three-fold symmetrical magnetic field having a center located in a position conjugate with the first multipole element; and a doublet lens located between the first and second multipole elements to shift the electron diffraction image formed in the center of the first multipole element to the center of the second multipole element.

The present invention also provides a transmission electron microscope comprising: an illumination lens and an auxiliary illumination lens that are interlocked to form an electron diffraction image at a back focal plane of an objective lens at all times independent of a current density on a specimen; the objective lens forming a hexapole field and having a center brought into coincidence with the back focal plane of the objective lens; a multipole element for producing a three-fold symmetrical magnetic field located in a position conjugate with the back focal plane that is the center of the hexapole field; and a doublet lens located between the hexapole field and the multipole element to shift the electron diffraction image formed at the back focal plane to the center of the magnetic field produced by the multipole element, the back focal plane being in the center of the magnetic field of the hexapole field.

Other objects and features of the invention will appear in the course of the description thereof, which follows.

BRIEF DESCRIPTION OF THE DRAWINGS

FIGS. 11(a) and 11(b) are diagrams comparing two examples of a post-specimen imaging optical system in accordance with the present invention with the conventional post-specimen imaging optical system shown in FIG. 10.

DESCRIPTION OF THE PREFERRED EMBODIMENTS

The preferred embodiments of the present invention are hereinafter described with reference to the accompanying drawings. In the following description, hexapole elements are used as multipole elements.

Figure 1:
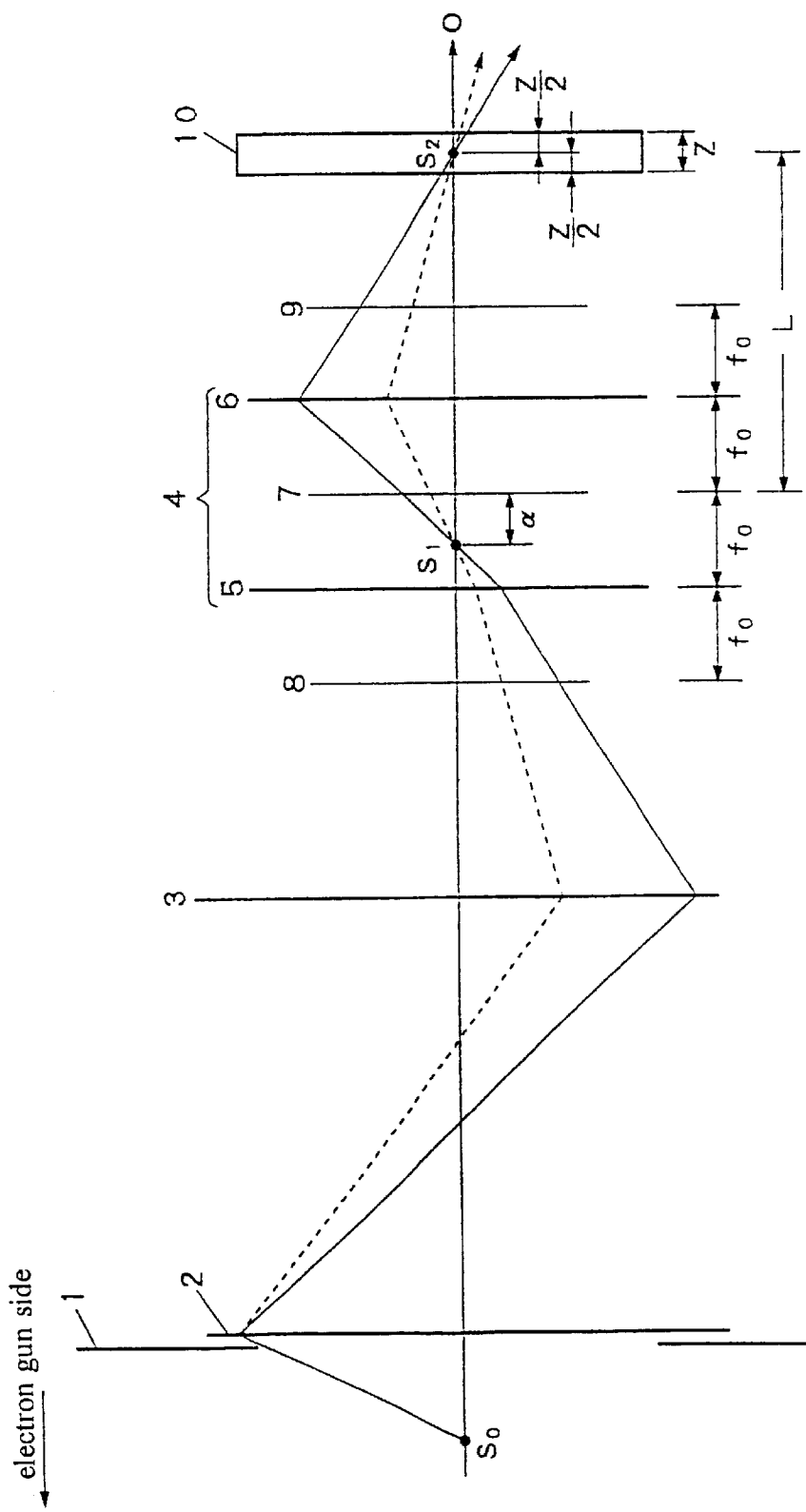
FIG. 1 is a diagram of an illumination optical system for use in a transmission electron microscope, the illumination optical system being built in accordance with the present invention.
Figure 2:
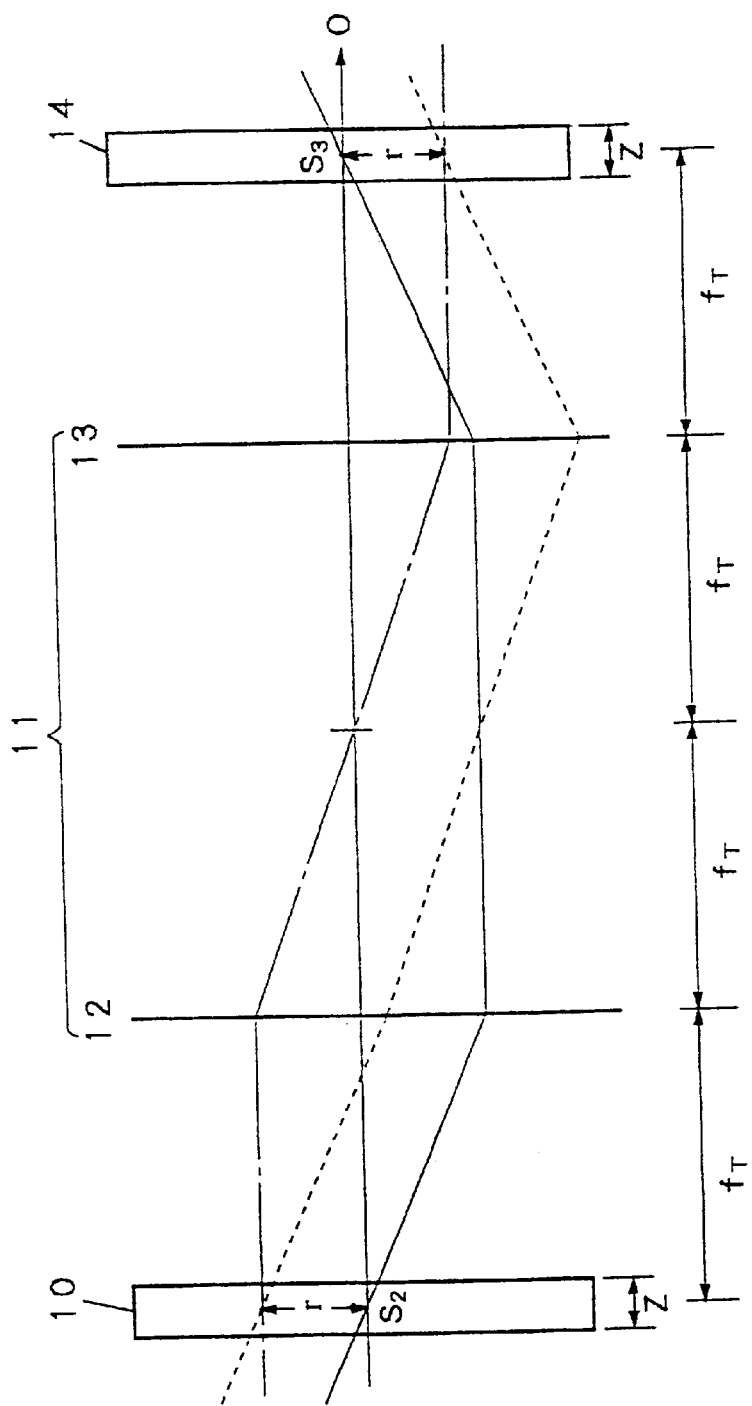
FIG. 2 is a diagram of an imaging optical system for use in a transmission electron microscope, the imaging optical system being built in accordance with the present invention.

Referring to FIGS. 1 and 2, the optical system of a TEM (transmission electron microscope) in accordance with a first embodiment of the present invention is shown. FIG. 1 shows its illumination optical system. FIG. 2 shows its imaging optical system. Shown in these figures are an illumination aperture 1, an illumination lens 2, an auxiliary illumination lens 3, an objective lens 4, and a specimen 7. The objective lens 4 acts as two lenses, i.e., a front lens 5 and a rear lens 6, when it is strongly excited, and has a front focal plane 8 and a back focal plane 9. Also shown are hexapole element 10, a doublet lens 11 made up of transfer lenses 12 and 13, another hexapole element 14, a source $S_0$, and an optical axis O. The objective lens 4 has a focal distance of $f_0$. The specimen 7 is located at a distance of L from the center position $S_2$ of the hexapole element 10. For convenience, only the principal planes of the various lenses are shown. Although the hexapole element 10 is included in the imaging optical system, this hexapole element is also shown in FIG. 1 for ease of understanding.

First, the illumination optical system is described by referring to FIG. 1, where the optical axis O is taken on the horizontal axis. The light source $S_0$ is located at the left end of the optical axis O and closer to the electron gun than the illumination lens 2. The light source $S_0$ is a crossover point closest to the illumination lens 2.

Electrons from the source $S_0$ are limited by the illumination aperture 1 and directed to the specimen 7 via the illumination lens 2, the auxiliary illumination lens 3, and the front lens 5 of the objective lens 4. The illumination lens 2 and the auxiliary illumination lens 3 are excited in step with each other such that a crossover point (hereinafter referred to as the first crossover point) located immediately ahead of the specimen 7 is formed as a fixed point at a position $S_1$. In the example shown in FIG. 1, the first crossover point $S_1$ is spaced by α from the specimen 7 toward the electron gun. The objective lens 4 focuses an image of the specimen 7 at an infinitely remote point. This phenomenon is referred to as "infinite point imaging" herein. In TEM, it is customary to set up the objective lens 4 to provide infinite point imaging.

Therefore, as the illumination lens 2 is excited more strongly, the auxiliary illumination lens 3 is excited less strongly. In addition, the current density on the specimen 7 decreases. Conversely, as the illumination lens 2 is excited less strongly, the auxiliary illumination lens 3 is excited more strongly, and the current density on the specimen 7 increases. In spite of this interlocking control to vary the current density on the specimen 7, the crossover point is held at the point $S_1$ of FIG. 1. In FIG. 1, the ray diagram indicated by the solid line indicates the trajectory of electrons where the illumination lens 2 is excited strongly and the auxiliary illumination lens 3 is excited weakly. The ray diagram indicated by the broken line indicates the trajectory of electrons where the illumination lens 2 is excited strongly while the auxiliary illumination lens 3 is excited weakly.

A condenser lens normally mounted in a transmission electron microscope may be used as the illumination lens 2 described above. A condenser mini-lens usually mounted in a transmission electron microscope may be used as the auxiliary illumination lens 3. In the past, the condenser lens and the condenser mini-lens have not been interlocked in use. By interlocking them as mentioned above, the position of the crossover point $S_1$ located immediately ahead of the specimen 7 can be fixed.

Electrons passing through the specimen 7 are caused to form an image of the source $S_0$, i.e., a crossover point, by the action of the rear lens 6 of the objective lens 4 at a distance of L from the specimen 7 on a plane (hereinafter referred to as the plane $S_2$) perpendicular to the optical axis O, the plane $S_2$ including a point indicated by $S_2$ in FIG. 1. This crossover point may hereinafter be referred to as the second crossover point. An electron diffraction pattern of the specimen 7 is formed on the plane $S_2$. The hexapole element 10 is so positioned that the center of the length Z of the magnetic field taken in the direction of the optical axis is coincident with the plane $S_2$.

That is, the crossover point $S_1$ immediately ahead of the specimen 7 and the position $S_2$ of the center of the hexapole element 10 are conjugate with each other. Therefore, if the current density on the specimen 7 is varied, the second crossover point of the light source $S_0$ is kept at the plane $S_2$. An electron diffraction image of the specimen 7 is formed on the plane $S_2$. If the electrons impinge on the specimen in a parallel relation to the optical axis O, an electron diffraction image is formed at the back focal plane 9 of the objective lens 4. On the other hand, electrons which impinge on the specimen 7 at an angle to the optical axis O form an electron diffraction image at the plane $S_2$ of FIG. 1 that is in the center of the hexapole element 10 rather than at the back focal plane 9, as indicated by the ray diagram of FIG. 1.

The illumination optical system is designed as shown in FIG. 1 for the following reason. Some of the electrons passing through the specimen 7 are not acted on at all by the specimen 7 and pass through the specimen 7 straight as indicated by A in FIG. 3. These electrons are referred to as the zeroth-order transmission electrons. Furthermore, some electrons leave the specimen 7 at an angle of $\phi$ to the zeroth-order passage electrons as indicated by B in FIG. 3.

This angle $\phi$ that the electrons exiting from the specimen 7 form with the zeroth-order transmission electrons is conveniently referred to as the "specimen exit angle" or as the "exit angle". It is known that the amount of blurring produced by spherical aberration caused by the objective lens 4 is in proportion to the specimen exit angle $\phi^3$ of the electrons. That is, the amount of blurring due to the spherical aberration is given by amount of blurring due to spherical aberration $\alpha$ Cs $\phi^3$ (2)

Consequently, it can be seen that the zeroth-order transmission electrons having a specimen exit angle of 0° (zero degrees) undergo no spherical aberration and that only electrons having nonzero specimen exit angles undergo spherical aberration.

Figure 3:
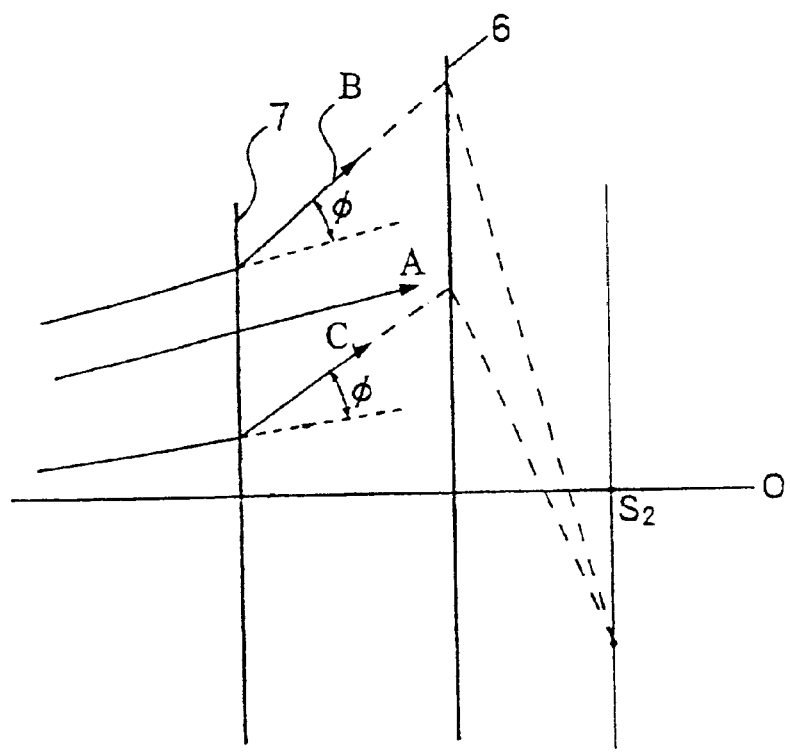
FIG. 3 is a diagram illustrating why the illumination optical system is designed as shown in FIG. 1.

For instance, if electrons hitting different positions on the specimen 7 exit from the specimen 7 at the same specimen exit angle $\phi$ as indicated by B and C, respectively, in FIG. 3, then the amounts of blurring that these two kinds of electrons respectively undergo due to spherical aberration are identical. Accordingly, the same amount of correction must be given to the electrons indicated by B and C, respectively, to correct the spherical aberration.

Therefore, it is expected that if electrons leaving the specimen at the same exit angle are made to converge at the same position on an aberration-corrected plane by the rear lens 6 of the objective lens 4, then it is easy to give the same amount of correction to these electrons having the same exit angle. Preferably, the focal point does not move if the current density on the specimen 7 is varied. If the focal point moves, the amount of action from the imaging optical system (described later) will become different. This will make it impossible to correct the spherical aberration.

Accordingly, the illumination optical system is designed as described above. If the current density on the specimen 7 is varied, the position (i.e., the second crossover point) of the electron diffraction image on the specimen 7 formed by the objective lens 4 is fixed. In other words, a crossover point of the zeroth-order transmission electrons is formed at a position on the optical axis O on the plane $S_2$ by the illumination optical system. Crossover points of scattered electrons leaving at nonzero exit angles $\phi$ are scattered over positions corresponding to the values of the exit angles $\phi$ on the plane $S_2$ (see FIG. 3).

The imaging optical system is next described by referring to FIG. 2. Electrons exiting from the hexapole element 10 pass through the doublet lens 11 made up of the two transfer lenses 12 and 13, and enter the hexapole element 14. The transfer lenses 12 and 13 have a focal distance of $f_T$. The distance between the center of the hexapole element 10 and the transfer lens 12 is also $f_T$. Furthermore, the distance between the transfer lens 13 and the center of the hexapole element 14 is $f_T$. The distance between the transfer lens 12 and the transfer lens 13 is $2f_T$. The length of the magnetic field produced by the hexapole element 14 in the direction of the optical axis is the same as that of the hexapole element 14, i.e., Z. The hexapole elements 10 and 14 are arranged similarly as described later.

This imaging optical system places the hexapole elements 10 and 14 in conjugate positions. Furthermore, they are identical in tilt of electron trajectory on the conjugate plane and in magnification.

Therefore, the electron diffraction image of the hexapole element 10 formed on the plane $S_2$ is rotated through 180° by the doublet lens 11 and shifted onto a plane (hereinafter simply referred to as plane $S_3$) perpendicular to the optical axis O including a point indicated by $S_3$ in FIG. 2, the point being the center of the hexapole element 14. That is, the second crossover point on the plane $S_2$ is projected onto the plane $S_3$ as a third crossover point.

In this way, the crossover point (the first crossover point) located immediately ahead of the specimen 7 and the plane $S_2$ are in positions conjugate with each other. Furthermore, the planes $S_2$ and $S_3$ are conjugate with each other. Consequently, the position of the plane $S_3$ is fixed and does not move if the current density on the specimen 7 varies.

In FIG. 2, the ray diagram indicated by the solid line shows a trajectory of off-axis zeroth-order transmission electrons at the specimen 7. The ray diagram indicated by the broken line shows trajectories of off-axis gth-order (higher than the zeroth-order) scattered electrons at the specimen 7. Since the objective lens 4 focuses an image of the specimen 7 at an infinitely remote position, the trajectories of the on-axis gth-order scattered electrons at the specimen 7 are made parallel to the optical axis by the objective lens 4 and indicated by the ray diagram denoted by the dot-and-dash line.

The spherical aberration is corrected by the structure described above. The manner in which the correction is made is described below.

Figure 4A:
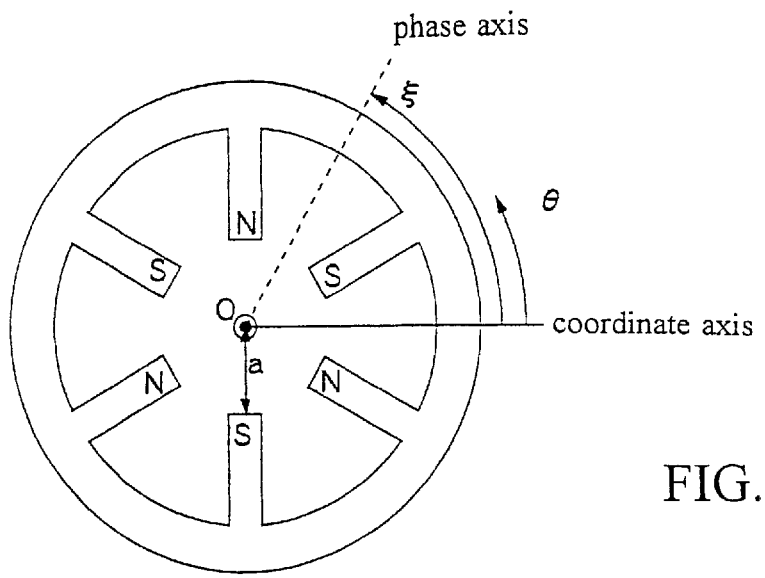
FIG. 4(a) is a plan view of a hexapole element.
Figure 4B:
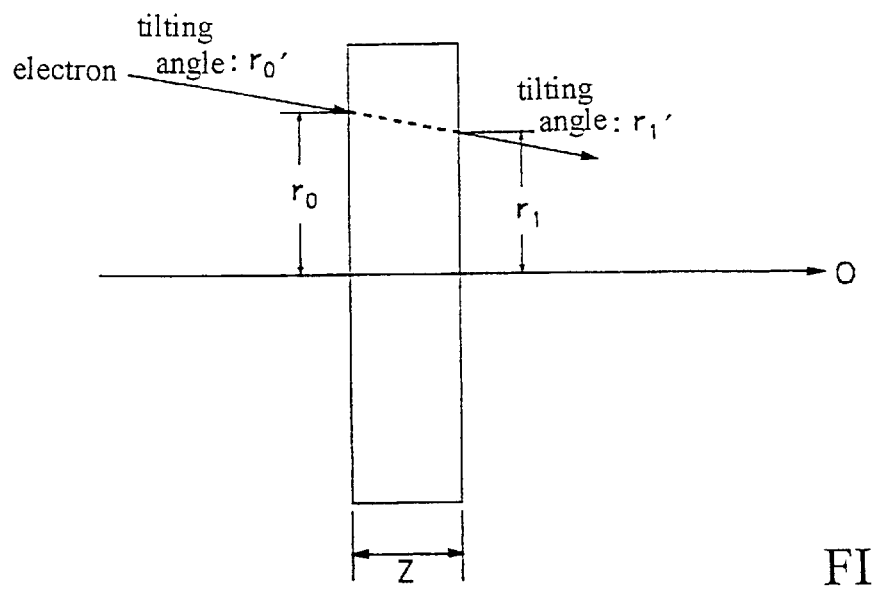
FIG. 4(b) is a diagram illustrating the action of the hexapole element shown in FIG. 4(a)

The structure of a hexapole element and its general action are briefly described. The structure and operation of hexapole elements are known. A hexapole element consists of deflection coils arranged around an optical axis to create a hexapole field. One example is shown in FIG. 4(a). Usually, a hexapole element is made up of eight or more coils to permit one to control the phase angle $\xi$ of the hexapole field at will. In FIG. 4(a), for simplicity of illustration, six coils are shown to be equally spaced from each other around an optical axis. The hexapole field is a magnetic field with three-fold symmetry, as is well known in the art. The magnetic field with three-fold symmetry means that whenever the field is rotated through a given angle (120° in this example) about the optical axis, the resulting magnetic field assumes the same form as the original magnetic field. This nature is referred to as rotational symmetry, more specifically, three-fold rotational symmetry. The distance between the optical axis O and the front end of each coil is called the bore radius, indicated by a. As shown in FIG. 4(a), the phase angle $\xi$ of the hexapole field is formed around an optical axis between a phase axis and a coordinate axis that is established to introduce equations of trajectories as described later. In the figure, the phase angle $\xi$ of the hexapole field is $\pi/3$. As shown in FIG. 4(b), let Z be the length of the hexapole field taken along the direction of the optical axis.

As shown in FIG. 4(b), it is assumed that electrons enter the hexapole element at a distance of $r_0$ from an optical axis O at a tilting angle of $r_0'$ to the hexapole element and that a hexapole field produced by the hexapole element has a phase angle $\xi=/3$. Let $r_1$ be the distance from the optical axis O when the electrons are emitted from the hexapole element. Let $r_1'$ be the tilting angle that the electrons form with the hexapole element.

Neglecting the fourth- and higher-order terms, they are given by $$r_1 = r_0(1+t) + kr_0^2 Z^2 L \cos 3\theta + k^2 r_0^3 Z^4 M \qquad (3)$$

$$r_1' = r_0' + kr_0^2 Z N \cos 3\theta + k^2 r_0^3 Z^3 P \qquad (4)$$

where $\theta$ is the incidence angle of the electrons to the coordinate axis of the hexapole field, Z is the length of the hexapole field taken in the direction of the optical axis, k is the strength of the hexapole field, and t, L, M, N, and P are constants determined by the incident conditions of the trajectory and given by $$t = \left(\frac{r_0'}{r_0}\right)Z \qquad (5)$$

$$L = \frac{1}{2} + \frac{t}{3} + \frac{t^2}{12} \qquad (6)$$

$$M = \frac{1}{12} + \frac{t}{12} + \frac{t^2}{36} + \frac{t^3}{252} \qquad (7)$$

$$N = 1 + t + \frac{t^2}{3} \qquad (8)$$

$$P = \frac{1}{3} + \frac{5t}{12} + \frac{t^2}{6} + \frac{t^3}{36} \qquad (9)$$

The first term $r_0(1+t)$ of the right side of Eq. (3) is a zeroth-order term. That is, this term indicates a component of the electrons that passes through the hexapole field intact without being acted on by the field. The second term $kr_0^2 Z^2 L \cos 3\theta$ of the right side of Eq. (3) indicates the component of the principal effect of the hexapole field. This effect is herein referred to as the primary effect. Since the hexapole field is a magnetic field with three-fold rotational symmetry, if the cross-sectional shape of the incident electron beam on the hexapole field is circular, the electron beam transmitted through the hexapole field assumes a substantially triangular cross-sectional form. This is the primary effect of the second term. In this way, the primary effects exhibit three-fold rotational symmetry.

On the other hand, the third term $k^2 r_0^3 Z^4 M$ of the right side of Eq. (3) indicates an aberration term indicating the aberration component produced by the hexapole field. This may hereinafter be referred to as the secondary effect. The third aberration term (the secondary effect) is the third-order term of $r_0$ and indicates that it exhibits a perfectly uniform axial symmetry about the optical axis. That is, the geometrical distribution of the secondary effect exhibits axial symmetry about the optical axis in the same way as a round lens.

The same theories apply to Eq. (4). The first term $r_0'$ of the right side of Eq. (4) is a zeroth-order term. The second term $kr_0^2 Z N \cos 3\theta$ indicates the component of the primary effect of the hexapole field, and the third term $k^2 r_0^3 Z^3 P$ indicates the aberration term of the hexapole field, i.e., the component of the secondary effect. The second term indicates three-fold rotational symmetry. The third term is the third-order term of $r_0$ and indicates that it provides a perfectly uniform axial symmetry about the optical axis.

The following can be anticipated if the properties of the hexapole field described above are utilized. The primary effects that are useless to us exhibit a three-fold rotational symmetry and so if two hexapole fields are combined ingeniously, then the primary effects should be canceled out. On the other hand, the secondary effect, or the aberration term, exhibits an axial symmetry independent of rotation about the axis. Therefore, the secondary effect can be treated similarly to a round lens. Furthermore, if the sign of the aberration term is opposite to the sign of a general round lens (opposite in practice), the hexapole should function as a concave lens. That is, the aberration should be corrected.

While the general structure of a hexapole element and its operation have been described, the operation of the imaging optical system shown in FIG. 2 is described below.

As mentioned previously, the objective lens 4 provides infinite point imaging. On-axis electrons from the specimen 7 leave the objective lens 4 parallel to the optical axis. Therefore, the on-axis electrons hit the hexapole element 10 parallel to the optical axis. Consequently, the relation $r_0'=0$ can be established. By substituting this into Eqs. (3)–(9), we have the following relations about the hexapole element 10:

$$r_1 = r_0(1+t) + kr_0^2 Z^2 L \cos 3\theta + k^2 r_0^3 Z^4 M \qquad (10)$$

$$r_1' = kr_0^2 Z N \cos 3\theta + k^2 r_0^3 Z^3 P \qquad (11)$$

$$t = 0 \qquad (12)$$

$$L = \frac{1}{2} \qquad (13)$$

$$M = \frac{1}{12} \qquad (14)$$

$$N = 1 \qquad (15)$$

$$P = \frac{1}{3} \qquad (16)$$

Note that Eq. (10) is the same as Eq. (3).

As mentioned already, the hexapole elements 10 and 14 are conjugate with each other. Furthermore, they are identical in tilt of electron trajectory and in magnification. Electron diffraction images of the specimen 7 are formed in the centers of the hexapole elements 10 and 14, respectively.

The two hexapole elements 10 and 14 shown in FIG. 2 are arranged similarly. In particular, where the hexapole element 10 is arranged as shown in FIG. 4(a), for example, it follows that the hexapole element 14 is also arranged as shown in FIG. 4(a). Therefore, the two hexapole elements 10 and 14 are at the same distance from the optical axis O. Their magnetic field strengths at the same phase incidence angle θ are the same.

Thus, the following can be said. Owing to the action of the doublet lens 11, the incident position on the hexapole element 14 and the tilt are given by $(r_1-r_{1'Z})$ and $r_1'$, respectively. Let $r_2'$ be the tilt of the trajectory of electrons at the exit surface of the hexapole element 14. Since Eqs. (3)–(9) can be applied to this hexapole element 14, use of these equations leads to $$r_2' = \left(\frac{2}{3}\right) k^2 r_0^3 Z^3 \tag{17}$$

The foregoing case holds where the phase angle ξ is π/3. Where the phase angle ξ is other than π/3, calculations demonstrate that Eq. (17) holds up to the third-order term. Since it is considered that the contents are essentially the same as in the case of π/3, the contents will not be described below.

A spherical aberration of the objective lens 4 due to the spherical aberration coefficient Cs means that the trajectory of electrons exiting from the specimen at a nonzero exit angle φ is tilted at an additional angle of δ due to the spherical aberration coefficient Cs of the objective lens 4 having a focal distance of $f_0$, the objective lens 4 being so set as to provide infinite point imaging. It is known that this angle δ is given by $$\delta = -\left(\frac{Cs}{f_0}\right)\phi^3 \tag{18}$$

That is, in the optical system shown in FIGS. 1 and 2, the trajectory of electrons departing from the specimen 7 at a nonzero exit angle of φ is further tilted at the angle δ given by Eq. (18) due to the spherical aberration coefficient Cs of the objective lens 4. When the electrons pass through the hexapole element 10 and the doublet lens 11 and leave the hexapole element 14, the tilt is given by Eq. (17).

Therefore, the spherical aberration due to the objective lens 4 can be corrected by establishing the relation given by $$r_2'+\delta=0 \tag{19}$$

Accordingly, Eqs. (17) and (18) are substituted into Eq. (19), and the equations are solved for the strength k of the hexapole field. This gives rise to $$k = \left(\frac{3Cs\phi^3}{2f_0 r_0^3 Z^3}\right)^{1/2} \tag{20}$$

Since the objective lens 4 provides infinite point imaging, we have $$r_0 = \phi f_0 \tag{21}$$

Substituting Eq. (21) into Eq. (20) results in $$k = \left(\frac{3Cs}{2Z^3 f_0^4}\right)^{1/2} \tag{22}$$

That is, the spherical aberration due to the objective lens 4 can be corrected by setting the strengths of the hexapole field produced by the two hexapole elements 10 and 14 to the values given by Eq. (22). Using actual physical quantities, the strength k of this hexapole field is given by $$k = \frac{3u_0 I}{a^3 R} \tag{23}$$

where $u_0$ is the magnetic permeability in vacuum, I is the coil ampere-turn of the hexapole elements, R is the magnetic rigidity of electrons, and a is the bore radius of the hexapole elements.

As can be seen from the description provided thus far, spherical aberrations can be corrected. The items described above are further qualitatively described below.

First, when correction of spherical aberration is considered, attention should be paid to the tilt $r_1'$ of the trajectory when electrons exit from the hexapole element 10 and to the tilt $r_2'$ of the trajectory when the electrons exit from the hexapole element 14.

In the imaging optical system shown in FIG. 2, the tilt $r_1'$ when electrons go out of the hexapole element is given by Eq. (11). The first term $kr_0^2 Z$ N cos 3θ of the right side of Eq. (11) is the component of the primary effect of the hexapole field, and the second term $k^2 r_0^3 Z^3 P$ is the component of the secondary effect of the hexapole field, i.e., an aberration term. The tilt $r_2'$ of the trajectory when the electrons leave the hexapole element 14 is similarly expressed.

The electron diffraction image of the hexapole element 10 formed on the plane $S_2$ is rotated through 180° and shifted onto the plane $S_3$ that is in the center of the hexapole element 14 by the doublet lens 11. Consequently, the phase angle θ at the location where the electrons enter the hexapole element 10 makes a difference of 180° with the phase angle θ' at the location where the electrons enter the hexapole element 14.

Accordingly, if the component of the primary effect of the hexapole field produced by the hexapole element 10 is $kr_0^2 Z$ N cos 3θ, then the component of the primary effect of the hexapole field developed by the hexapole element 14 is $-kr_0^2 Z$ N cos 3θ. Therefore, the primary effect produced by the hexapole field produced by the hexapole element 10 is canceled by the primary effect of the hexapole field produced by the hexapole element 14.

In particular, the electron beam entering the hexapole element 10 and having a circular cross-sectional shape is shaped into a substantially triangular form by the primary effect of the three-fold symmetry magnetic field produced by the hexapole element 10. The electron beam of substantially triangularly-shaped cross section is acted on by the primary effect of the three-fold symmetry magnetic field developed by the hexapole element 14 in a direction opposite to the direction in which the electrons having a circular cross-sectional shape are shaped into a substantially triangular form. Hence, when the electrons exit from the hexapole element 14, the cross-sectional shape of the beam is returned to the circular form.

With respect to the secondary effect, i.e., the aberration term, the aberration term is not a function of the phase angle θ but rather provides a perfectly uniform axial symmetry about the optical axis. Hence, the aberration due to the hexapole element 10 and the aberration due to the hexapole element 14 add constructively. Furthermore, the aberrations due to the hexapole elements 10 and 14, respectively, have the same dimension as the spherical aberration coefficient Cs of the objective lens 4 but are opposite in sign, as is well known in the art.

Accordingly, the spherical aberration introduced by the spherical aberration coefficient Cs of the objective lens 4 can be corrected by appropriately setting the strengths of the hexapole fields produced by the two hexapole elements 10 and 14. The strength of a hexapole field having correctable spherical aberration is given by Eq. (22) or (23).

Figure 5:
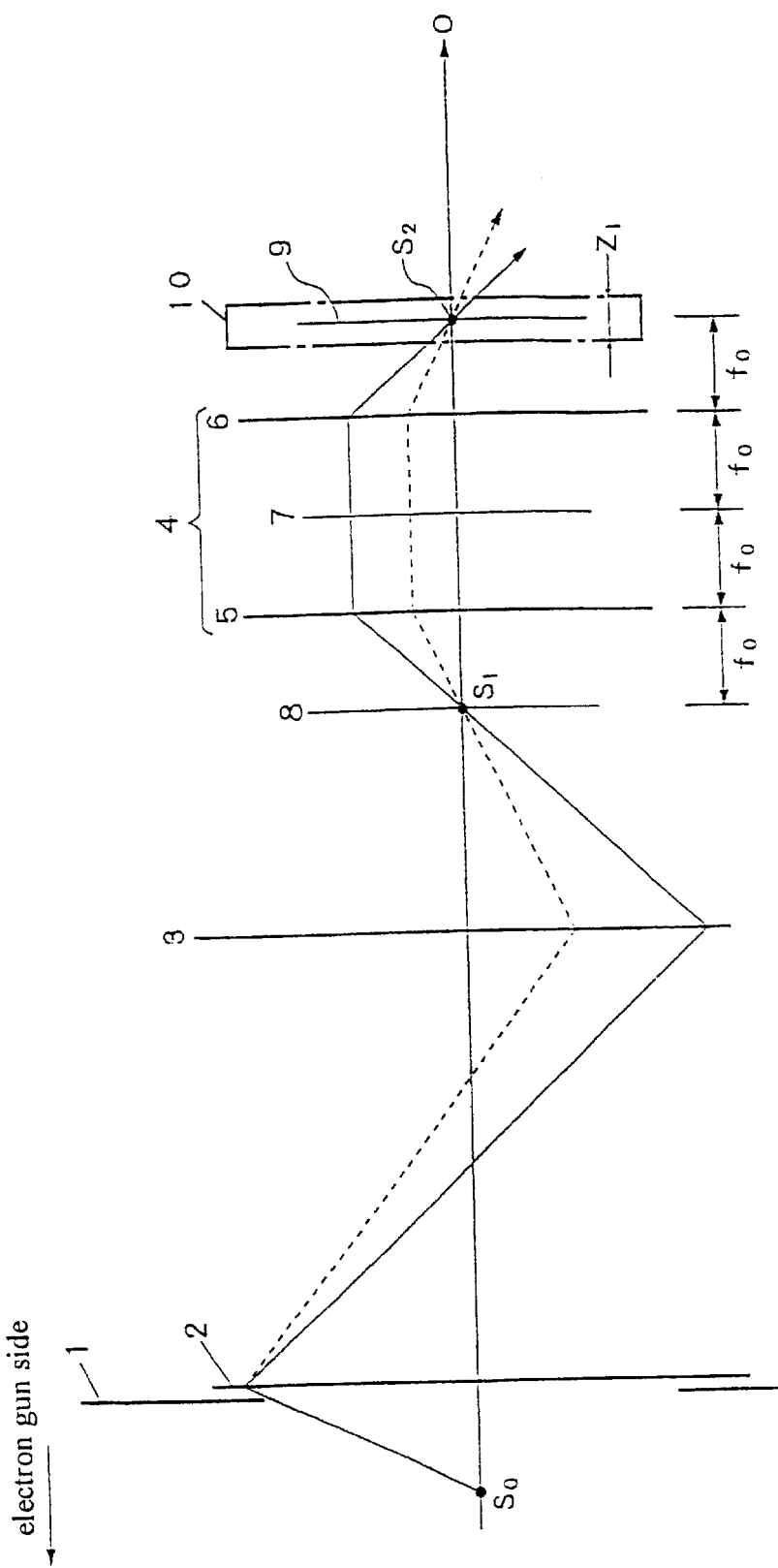
FIG. 5 is a diagram of another illumination optical system for use in a transmission electron microscope, the illumination optical system being built in accordance with the present invention.
Figure 6:
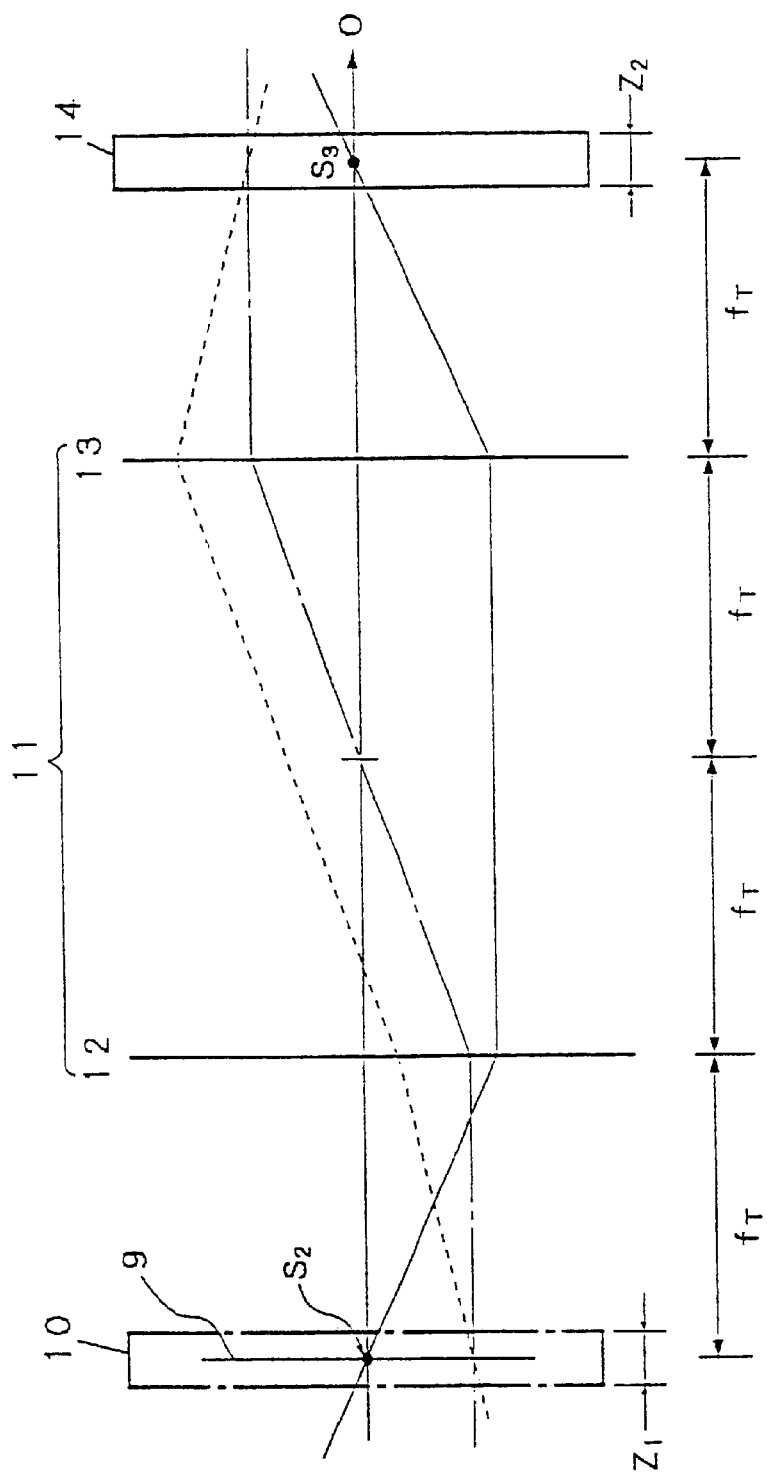
FIG. 6 is a diagram of another imaging optical system for use in a transmission electron microscope, the imaging optical system being built in accordance with the present invention.

FIGS. 5 and 6 show the optical system of a TEM (transmission electron microscope) in accordance with a second embodiment of the present invention. Those components which have been already described in the first embodiment in connection with FIGS. 1 and 2 are indicated by the same reference numerals as used in FIGS. 1 and 2 and will not be described below. A hexapole field 10b corresponds to the hexapole element 10 of FIG. 1. In FIGS. 5 and 6, only the principal planes of various lenses are shown. Generally, an illumination optical system refers to optics mounted between a specimen and an electron gun. For convenience, optics up to the hexapole field 10b of FIG. 5 are herein referred to as the illumination optical system. Furthermore, for the sake of illustration, the hexapole field 10b is also shown in the imaging optical system shown in FIG. 6.

First, the illumination optical system is described by referring to FIG. 5. In this figure, the optical axis O is taken on the horizontal axis. A light source $S_0$ is at the left end of the optical axis O. This light source $S_0$ is a crossover point located closer to the electron gun than the illumination lens 2 and closest to the illumination lens 2.

Electrons from the light source $S_0$ are limited by the illumination aperture 1 and directed onto the specimen 7 via the illumination lens 2, the auxiliary illumination lens 3, and the front lens 5 of the objective lens 4. The illumination lens 2 and the auxiliary illumination lens 3 are excited in an interlocked manner such that a crossover point is formed as a fixed point on the optical axis O and at the front focal plane 8. This may hereinafter be referred to as the first crossover point. In particular, if the illumination lens 2 is excited strongly, the auxiliary illumination lens 3 is excited weakly, and the current density on the specimen 7 decreases. Conversely, if the illumination lens 2 is excited weakly, the auxiliary illumination lens 3 is excited strongly, and the current density on the specimen 7 increases. In FIG. 5, the position of the front focal plane 8 on the optical axis O is indicated by $S_1$.

Accordingly, if one tries to vary the current density on the specimen 7, the excitation of the illumination lens 2 is varied. At this time, the excitation of the auxiliary illumination lens 3 is also varied in step. In consequence, the first crossover point is fixed at the position $S_1$ on the optical axis of the front focal plane 8 independent of the current density on the specimen 7.

Electrons passing across the first crossover point $S_1$ impinge on the specimen 7. Electrons transmitted through the specimen 7 form an electron diffraction image at the back focal plane 9. As shown in FIG. 5, the distance between the front focal plane 8 and the front lens 5, the distance between the front lens 5 and the specimen 7, the distance between the specimen 7 and the rear lens 6, and the distance between the rear lens 6 and the back focal plane 9 are all equal to the focal distance $f_0$ of the objective lens 4. Therefore, the electrons passing across the first crossover point $S_1$ are made parallel to the optical axis O by the action of the front lens 5 and impinge on the specimen 7, forming an electron diffraction image at the back focal plane 9. Accordingly, the position $S_2$ (FIG. 5) at the back focal plane 9 on the optical axis is the position of the electron diffraction image, and is a crossover point produced by projecting the first crossover point via the objective lens 4. This may hereinafter be referred to as the second crossover point.

It can be seen from the description provided thus far that the front focal plane 8 forming the first crossover point and the back focal plane 9 on which the electron diffraction image is formed are conjugate with each other. Consequently, if the current density on the specimen 7 varies, the electron diffraction image is fixed on the back focal plane 9. Hence, the second crossover point is also fixed.

In FIG. 5, the ray diagram indicated by the solid line indicates the trajectory of electrons where the illumination lens 2 is excited strongly and the auxiliary illumination lens 3 is excited weakly. The ray diagram indicated by the broken line indicates the trajectory of electrons where the illumination lens 2 is excited strongly while the auxiliary illumination lens 3 is excited weakly.

An image of the specimen 7 is focused at an infinitely remote point by the objective lens 4. In TEM, it is customary to set up the objective lens 4 to provide infinite point imaging, as mentioned previously.

The objective lens 4 is designed to form a hexapole field 10b at a point closer to the imaging optical system than the rear lens 6. In FIG. 5, the hexapole field 10b is indicated by the dot-and-dash line, meaning that coils for generating the hexapole field are not mounted in practice; rather, the hexapole field 10b is developed by the objective lens 4.

The center of the hexapole field formed by this objective lens 4 is made coincident with the back focal plane 9. That is, let $Z_1$ be the length of the magnetic field of the hexapole field 10b taken in the direction of the optical axis. The position of the center of the length $Z_1$ of the hexapole field 10b taken in the direction of the optical axis is made coincident with the back focal plane 9.

Figure 7:
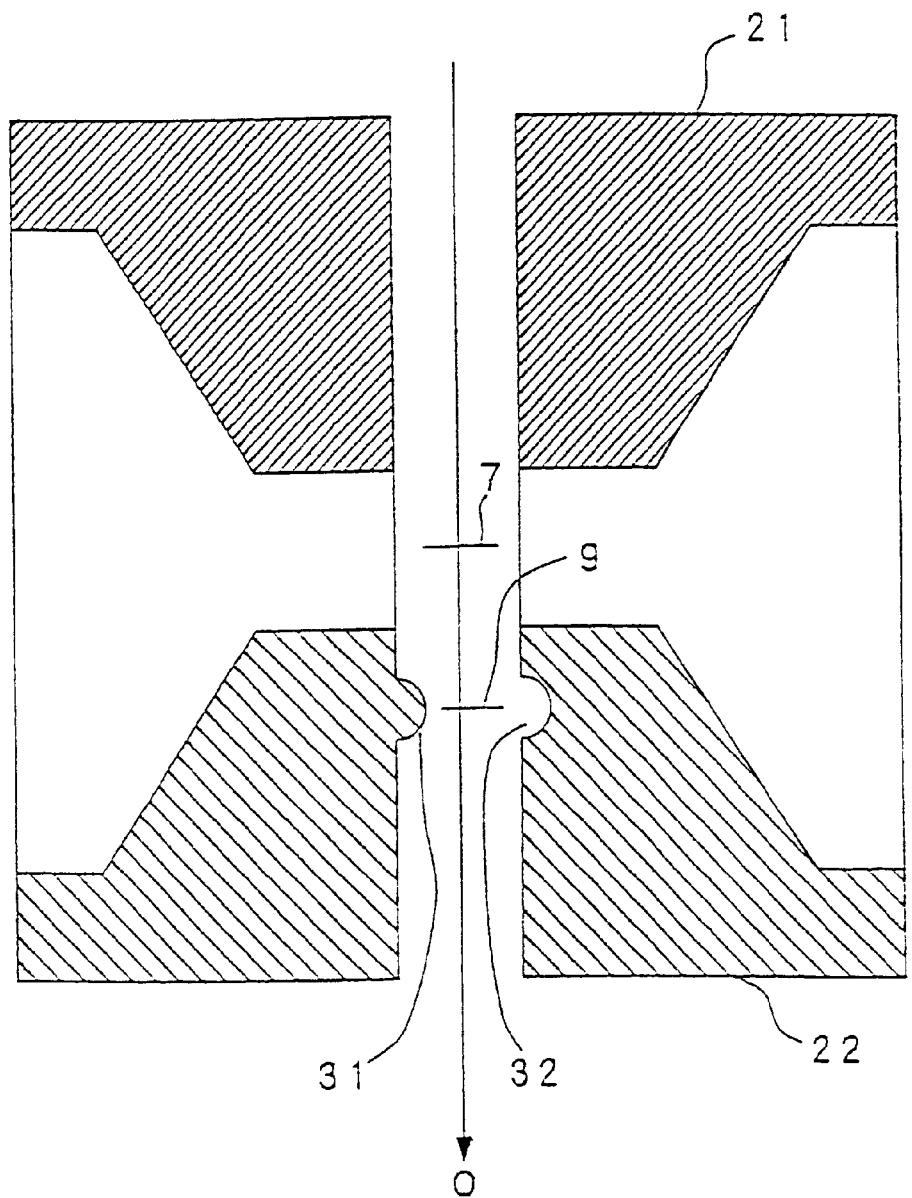
FIG. 7 is a cross-sectional view taken on a plane including the optical axis O of an objective lens 4, illustrating one example of machining of the objective lens for forming a hexapole field 10b at the position of the back focal plane 9.
Figure 8:
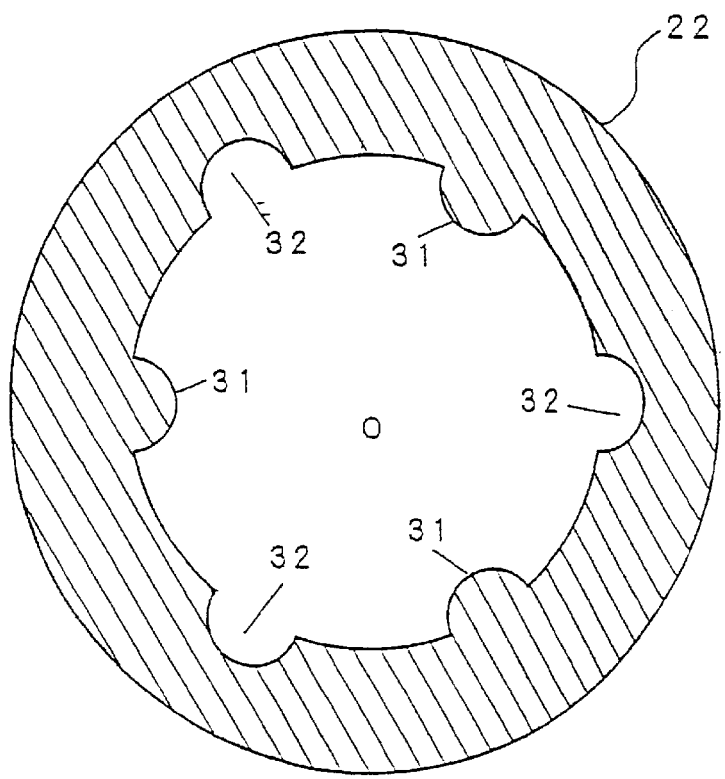
FIG. 8 is a cross-sectional view of a bottom polepiece 22 shown in FIG. 7, taken along the back focal plane 9, illustrating one example of machining of the objective lens for forming a hexapole field 10b at the position of the back focal plane 9.

To bring the center of the magnetic field produced by the hexapole field 10b into the back focal plane 9, the bottom polepiece of the objective lens 4 may be machined, for example, as shown in FIGS. 7 and 8, where there are shown the top polepiece 21, the bottom polepiece 22, a convex portion 31, and a concave portion 32.

FIG. 7 shows a cross section of the objective lens 4 taken along a plane including the optical axis O. FIG. 8 shows a cross section of the bottom polepiece 22 at the back focal plane 9. A specimen 7 is placed around the center of the gap between the top polepiece 21 and the bottom polepiece 22 of the objective lens 4. A magnetic field distribution produced closer to the electron gun (top of FIG. 7) than the specimen 7 forms the front lens 5 (not shown in FIG. 7). A magnetic field distribution closer to the imaging optical system (bottom side of FIG. 7) than the specimen 7 forms the rear lens 6 (not shown in FIG. 7). The back focal plane 9 is spaced by a distance equal to the focal distance $f_0$ from the position of the principal plane of the rear lens 6 toward the imaging optical system.

Usually, the back focal plane 9 lies within a space occupied by the bottom polepiece 22. Accordingly, as shown in FIG. 8, a convex portion 31 and a concave portion 32 are placed on the back focal plane 9 symmetrically with respect to the optical axis O. Three similar additional pairs of convex and concave portions are formed. These three pairs of convex and concave portions are spaced at intervals of 120° around the optical axis O. The vertex of the convex portion 31 and the bottom of the concave portion 32 are placed at the position of the back focal plane 9.

The hexapole field 10b where the center of the magnetic field is coincident with the position of the back focal plane 9 can be formed by machining the bottom polepiece 22 of the objective lens 4 as described above. That is, by machining the bottom polepiece 22 in this way, a round lens that would normally produce a magnetic field with a perfectly axial symmetry about the optical axis is made to produce the hexapole field 10b developing a three-fold symmetrical magnetic field. This is equivalently represented as shown in FIG. 5.

The strength of the hexapole field 10b, the length of the magnetic field taken in the direction of the optical axis, and other parameters can be adjusted by adjusting the shape of the convex portion 31, the height of the convex portion, the shape of the concave portion 32, the depth of the concave portion 32, and so on.

A condenser lens normally mounted in a transmission electron microscope may be used as the illumination lens 2 described above. A condenser minilens usually mounted in a transmission electron microscope may be used as the auxiliary illumination lens 3. In the past, the condenser lens and the condenser minilens have not been interlocked in use. By interlocking them as mentioned above, the position of the crossover point $S_1$ located immediately ahead of the specimen 7 can be fixed.

As described above, in this illumination optical system, an electron diffraction image of the specimen 7, i.e., the second crossover point, is formed at the back focal plane 9 independent of the current density on the specimen 7. The hexapole field 10b produced by the objective lens 4 is at the position of the back focal plane 9, for the same reason as in the case of the first embodiment described above.

Figure 9:
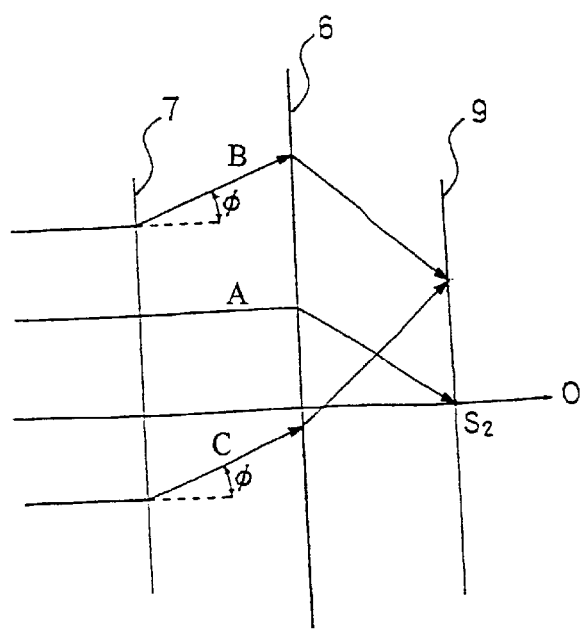
FIG. 9 is a diagram illustrating why the illumination optical system is designed as shown in FIG. 5.

In the geometry of the illumination optical system in accordance with this second embodiment, an electron diffraction image of the specimen 7 should be fixed at the back focal plane 9 of the objective lens 4 in a manner somewhat different from the first embodiment. Accordingly, this illumination optical system forms a crossover point of the zeroth-order transmission electrons as the second crossover point at the position $S_2$ in FIG. 5. Crossover points of scattered electrons having nonzero exit angles φ are scattered over positions corresponding to the values of the exit angle φ on the back focal plane 9 (see FIG. 9).

The imaging optical system is next described by referring to FIG. 6. Electrons exiting from the hexapole field 10b pass through the doublet lens 11 made up of the two transfer lenses 12 and 13, and enter the hexapole element 14. The transfer lenses 12 and 13 have a focal distance of $f_T$. The distance between the center of the hexapole field 10b and the transfer lens 12 and the distance between the transfer lens 13 and the center of the hexapole element 14 are all $f_T$. The distance between the transfer lens 12 and the transfer lens 13 is $2f_T$. Let $Z_2$ be the length of the magnetic field produced by the hexapole element 14 in the direction of the optical axis. The hexapole field 10b and the hexapole element 14 are arranged similarly as described later.

This imaging optical system places the hexapole field 10b and the hexapole element 14 in conjugate positions. Furthermore, they are identical in tilt of electron trajectory on the conjugate plane and in magnification.

Therefore, the electron diffraction image formed on the back focal plane 9 that is in the center of the magnetic field of the hexapole field 10b is rotated through 180° by the doublet lens 11 and shifted onto a plane (hereinafter simply referred to as plane $S_3$) perpendicular to the optical axis O and including a point indicated by $S_3$ in FIG. 6, the point being the center of the magnetic field produced by the hexapole element 14.

As mentioned previously, the first crossover point $S_1$ of the front focal plane 8 and the back focal plane 9 at which an electron diffraction image is formed are conjugate with each other. Since the hexapole field 10b and the hexapole element 14 are placed in conjugate positions, the position of the plane $S_3$ is fixed and does not move if the current density on the specimen 7 varies.

In FIG. 6, the ray diagram indicated by the solid line indicates the trajectory of off-axis zeroth-order transmission electrons. The ray diagram indicated by the broken line indicates the trajectory of off-axis gth-order (higher than the zeroth-order) scattered electrons. The objective lens 4 focuses an image of the specimen 7 at an infinitely remote position. Therefore, the gth-order scattered electrons on the axis of the specimen 7 are made parallel to the optical axis by the objective lens 4, and represented as the ray diagram indicated by the dot-and-dash line.

Because of the structure described above, the spherical aberration is corrected; in the same manner as in the first embodiment.

The hexapole field 10b formed by the objective lens 4 is different in physical structure from the hexapole element 14 but identical in function. Therefore, with respect to the action of the hexapole field 10b, the zeroth-order term corresponding to the first terms of Eqs. (3) and (4), the component of the primary effect corresponding to the second term, and the secondary effect (i.e., an aberration term) corresponding to the third term appear. The primary effect exhibits three-fold rotational symmetry. The aberration term exhibits a perfectly uniform axial symmetry about the optical axis.

While the general structure of the hexapole element and its operation have been described, the operation of the imaging optical system shown in FIG. 6 is described below.

As mentioned previously, the hexapole field 10b and the hexapole element 14 are arranged in the same form. This means that where the hexapole element 14 is arranged as shown in FIG. 6(a), the hexapole field 10b is formed on the bottom polepiece of the objective lens 4 as equivalently represented in FIG. 6(a).

Spherical aberration caused by the spherical aberration coefficient Cs of the objective lens 4 means that the trajectory of electrons leaving the specimen 7 at nonzero exit angle φ is further tilted by angle δ by the spherical aberration coefficient Cs of the objective lens 4 having the focal length of $f_0$, the objective lens 4 being set up to provide infinite point imaging. It is known that this angle δ is given by $$\delta = -\frac{Cs}{f_0}\phi^3 \qquad (24)$$

This has been already described in the first embodiment.

Therefore, of the tilt of the trajectory of electrons caused by the hexapole field 10b and the hexapole element 14, the angle of tilt δ of the electron trajectory due to spherical aberration can be canceled by setting the variation of the same component as the spherical aberration to −δ. Hence, the spherical aberration can be corrected.

We now discuss the amounts of variation introduced to the tilt of the trajectory of electrons of the same component as the spherical aberration by the hexapole field 10b and the hexapole element 14. First, when electrons pass through the hexapole element 14, the amount of tilt of the trajectory of the same component as the spherical aberration is given by the third aberration term of the right side of Eq. (4). As described previously, the first term of the right side of Eq. (4) is the zeroth-order term and so this term is not associated with the tilt of the trajectory. The second term is the component of the primary effect of the hexapole field. Therefore, when electrons pass through the hexapole element 14, if one pays attention only to those components of the tilt of the trajectory of electrons which are useful for correction of the spherical aberration, then the amount of variation is given by $k_2^2 r_0^3 Z_2^3 P$, where $k_2$ is the strength of the hexapole field produced by the hexapole element 14.

The same theory applies to the hexapole field 10b. Let $k_1$ be the strength of the hexapole field 10b. Let $Z_1$ be the length of this magnetic field taken in the direction of the optical axis. Let $r_0$ be the distance between the position at which electrons enter the hexapole field 10b and the optical axis. If one pays attention to the components of the tilt of the trajectory which are useful for correction of the spherical aberration, the tilt of the electrons passing through the hexapole field 10b varies by $k_1^2 r_0^3 Z_1^3 P$.

However, the polepieces of the objective lens 4 produce a strong magnetic field locally. Therefore, the length $Z_1$ of the magnetic field of the hexapole field 10b intentionally introduced by the illumination optical system shown in FIG. 5 is several millimeters. On the other hand, the length $Z_2$ of the magnetic field produced by the hexapole element 14 taken in the direction of the optical axis can be set to tens of millimeters, which is sufficiently greater than the length $Z_1$. Furthermore, the variation in the tilt of the trajectory of electrons having the same component as the spherical aberration is in proportion to the cube of the length of the hexapole field taken in the direction of the optical axis as indicated by the third term of the right side of Eq. (4). Thus, we can have $$k_1^2 r_0^3 Z_1^3 P \ll k_2^2 r_0^3 Z_2^3 P \qquad (25)$$

Where the amount of variation in the tilt of the trajectory of the electrons of the same component as the spherical aberration during the period between the moment when the electrons enter the hexapole field 10b and the moment when they leave the hexapole element 14, the component of the tilt of the trajectory due to the hexapole field 10b can be neglected. It is necessary to take account of only the variation in the component of the trajectory due to the hexapole element 14.

Thus, if the hexapole element 14 is designed to satisfy the following relation, the spherical aberration can be corrected:

$$k_2^2 r_0^3 Z_2^3 P + \delta = 0 \qquad (26)$$

Since the objective lens 4 provides infinite point imaging, the incident conditions under which electrons enter the hexapole element 14 can be set to $r_0' = 0$. It is known that the relation also approximately holds for off-axis electrons in TEM.

Substituting this equation $r_0' = 0$ into Eqs. (4), (5), and (9) results in $t=0$ and $P=\frac{1}{3}$. Therefore, Eq. (26) can be modified into the form $$\frac{k_2^2 r_0^3 Z_2^3}{3} + \delta = 0 \qquad (27)$$

Solving Eq. (27) for $k_2$ results in $$k_2 = \left( \frac{3 C_s \phi^3}{f_0 r_0^3 Z_2^3} \right)^{1/2} \qquad (28)$$

Since the objective lens 4 provides infinite point imaging, we have $$r_0 = \phi f_0 \qquad (29)$$

Substituting Eq. (29) into Eq. (28) gives rise to $$k_2 = \left( \frac{3 C_s}{Z_2^3 f_0^4} \right)^{1/2} \qquad (30)$$

That is, the spherical aberration caused by the objective lens 4 can be corrected by setting the strength of the hexapole field produced by the hexapole element 14 to a strength given by Eq. (30).

Using practical physical quantities, the strength $k_2$ of the hexapole field produced by the hexapole element 14 is given by $$k_2 = \frac{3 u_0 I}{a^3 R} \qquad (31)$$

where $u_0$ is the magnetic permeability in vacuum, I is the coil ampere-turn of the hexapole element 14, R is the magnetic rigidity of electrons, and a is the bore radius of the hexapole element.

The spherical aberration caused by the spherical aberration coefficient Cs of the objective lens 4 can be corrected as described above. The optical system shown in FIGS. 5 and 6 has an additional item that must be taken into consideration.

This is the primary effect produced by the hexapole field 10b and the hexapole element 14. This primary effect is induced by the fact that the magnetic field produced by the hexapole field 10b and the hexapole element 14 is a magnetic field with three-fold symmetry. Accordingly, if an electron beam having a circular cross-sectional shape vertical to the optical axis passes through the hexapole field 10b, the primary effect of the hexapole field 10b deforms the outgoing electron beam into a substantially triangular form. Similarly to the second term of the right side of Eq. (4), the primary effect of the hexapole field 10b is given by $$k_1 r_1^2 Z_1 N \cos 3\theta_1 \qquad (32)$$

where $r_{-1}$ is the distance of the incident position at which electrons enter the hexapole field 10b from the optical axis O and $\theta_1$ is the phase incidence angle of the hexapole field 10b at this incident position.

The electron beam whose cross-sectional shape is varied into a substantially triangular form by the primary effect of the hexapole field 10b passes through the doublet lens 11 and then through the hexapole element 14. The beam is further modified into a substantially triangular form by the primary effect of the hexapole element 14. Similarly to the second term of the right side of Eq. (4), the primary effect of the hexapole element 14 is given by $$k_2 r_0^2 Z_2 N \cos 3\theta_2 \qquad (33)$$

where $\theta_2$ is the phase incidence angle at the position where electrons enter the hexapole element 14.

Therefore, the primary effect of the hexapole field 10b and the primary effect of the hexapole element 14 can be canceled out by setting the values of Eqs. (32) and (33) to such a manner that they have the same absolute value and are opposite in sign. The cross-sectional shape of the electron beam departing from the hexapole element 14 can be returned to the circular form.

As mentioned previously, the hexapole field 10b and the hexapole element 14 are in conjugate positions. The electron trajectories passing through them are identical in tilt and magnification. An electron diffraction image of the specimen 7 formed at the back focal plane 9 that is in the center of the magnetic field produced by the hexapole field 10b is rotated through 180° by the doublet lens 11 and shifted onto the plane $S_3$ of FIG. 6 that is in the center of the magnetic field developed by the hexapole element 14. Furthermore, the hexapole field 10b and the hexapole element 14 are arranged similarly. Therefore, the values of N included in Eqs. (32) and (33) are identical. In addition, the following relations hold:

$$r_{-1} = r_0 \tag{34}$$

$$\theta_2 = \theta_1 + 180° \tag{35}$$

Accordingly, if the relation $$k_1 Z_1 = k_2 Z_2 \tag{36}$$

holds, then the primary effect produced by the hexapole field 10b and the primary effect produced by the hexapole element 14 can be canceled out.

In the optical system shown in FIGS. 5 and 6, the hexapole field 10b and the hexapole element 14 are designed to satisfy Eq. (36). As mentioned previously, the length $Z_2$ of the magnetic field produced by the hexapole element 14 is sufficiently greater than the length $Z_1$ of the magnetic field produced by the hexapole field 10b taken in the direction of the optical axis. Therefore, it is necessary that the strength $k_1$ of the magnetic field of the hexapole field 10b be sufficiently greater than the strength $k_2$ of the magnetic field produced by the hexapole element 14. Since the strength $k_1$ of the magnetic field of the hexapole field 10b can be adjusted by the height of the convex portion formed on the bottom polepiece of the objective lens 4, the depth of the concave portion, and other factors, these numerical values may be set to satisfy Eq. (36).

Figure 10:
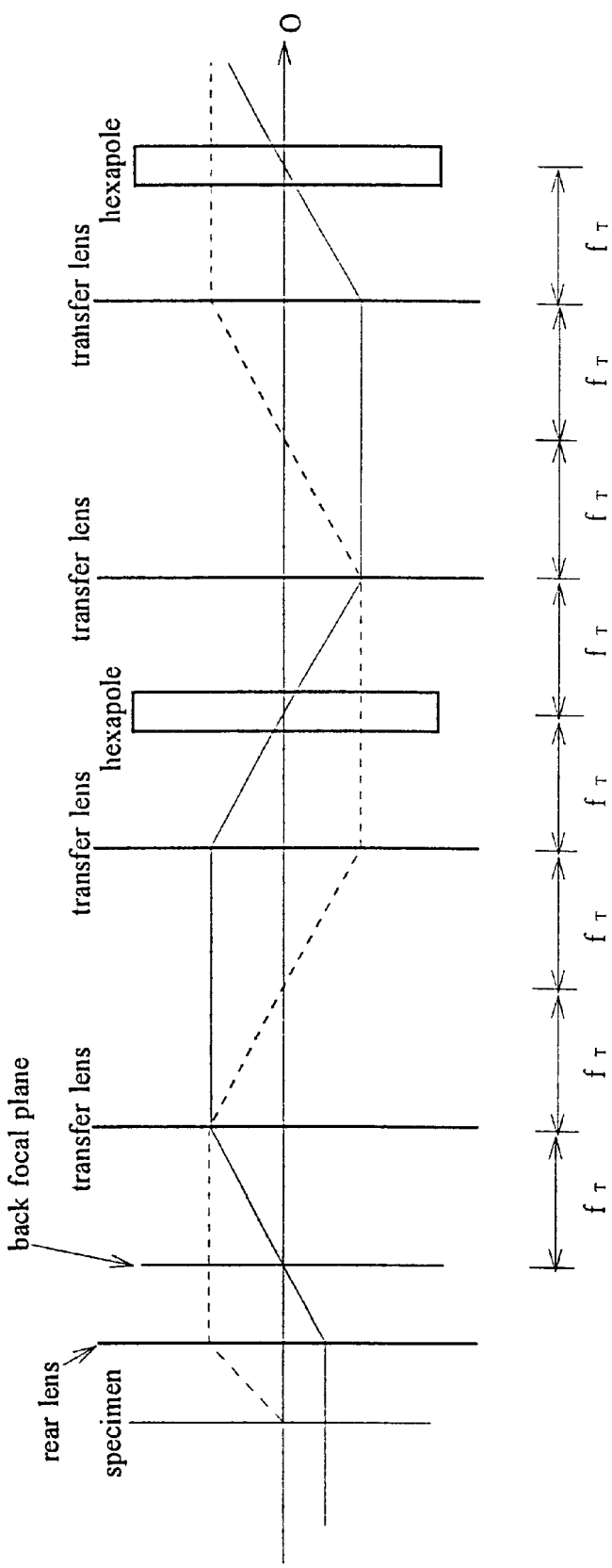
FIG. 10 is a diagram illustrating one conventional post-specimen imaging optical system.

Since the transmission electron microscope in accordance with the first embodiment is constructed as described above, spherical aberration due to the objective lens can be corrected. Consequently, the resolution during observation of images can be improved. Furthermore, only one doublet lens is necessary, because two illumination lenses of the illumination optical system are interlocked to fix a crossover point at a desired position. Hence, as shown in FIG. 11(a), the length of the microscope column can be shortened. FIGS. 11(a) and 11(b) illustrate post-specimen imaging systems in accordance with the present invention, for comparison with the prior art system shown in FIG. 10. FIG. 11(a) shows a post-specimen imaging system in accordance with the first embodiment. FIG. 11(b) shows a post-specimen imaging system in accordance with the second embodiment. As can be seen by comparing FIG. 11(a) with FIG. 10, the length of the microscope column in accordance with the first embodiment can be shortened by a length corresponding to more than $3f_T$ compared with the prior art system.

In the transmission electron microscope in accordance with the second embodiment, the hexapole field 10b can be produced by machining the bottom polepiece of the objective lens 4. In consequence, the length of the microscope column can be reduced to a minimum. That is, as can be seen by comparing FIG. 11(b) with FIG. 10, the second embodiment can reduce the length of the microscope column by a length corresponding to $4f_T$ compared with the prior art system.

While some preferred embodiments of the present invention have been described, the invention is not limited thereto. Rather, various changes and modifications are possible. For example, in the embodiments described above, one or two hexapole elements are used. Multipole elements or coils for producing a magnetic field with three-fold symmetry can be employed.

Having thus described my invention with the detail and particularity required by the Patent Laws, what is desired protected by Letters Patent is set forth in the following claims.

What is claimed is:

1. A transmission electron microscope comprising:

an illumination system for illuminating a specimen position with an electron beam, said illumination system having two illumination lenses that are interlocked to form an image of a source at a first crossover point at a first position in the immediate vicinity of said specimen position and upstream thereof;

an objective lens for focusing an image of said specimen at a point at infinity, said objective lens forming an image of said first crossover point at a second crossover point at a second position in the vicinity of said objective lens and downstream thereof;

a first multipole element for producing a magnetic field with three-fold symmetry, said first multipole element being located at said second position;

a second multipole element for producing a magnetic field with three-fold symmetry, said second multipole element being located downstream of said first multipole element; and a doublet lens located between said first and second multipole elements to project said second crossover point onto the position of said second multipole element as a third crossover point.

2. A transmission electron microscope comprising:

an illumination optical system for directing an electron beam onto a specimen, said illumination optical system having two illumination lenses that are interlocked to form a crossover point at a first position in the immediate vicinity to said specimen and upstream thereof;

an objective lens for focusing an image of said specimen at a point at infinity and forming an electron diffraction image of said specimen at a second position when said first crossover point exists at said first position;

a first multipole element for producing a magnetic field with three-fold symmetry, said first multipole element being located at the position where said electron diffraction image is formed;

a second multipole element for producing a three-fold symmetrical field, said second multipole element being located at a position conjugate with said first multipole element; and a doublet lens located between said first and second multipole elements to project an electron diffraction image formed at the position of said first multipole element onto the position of said second multipole element.

3. A transmission electron microscope comprising:

an illumination optical system for directing an electron beam onto a specimen, said illumination optical system having two illumination lenses that are interlocked to form a crossover point at a first position independent of a current density on said specimen in the immediate vicinity of said specimen and upstream thereof;

an objective lens for focusing an image of said specimen at a point at infinity and forming an electron diffraction image of said specimen at a fixed second position when said crossover point exists at said first position;

a first multipole element for producing a first magnetic field with three-fold symmetry, said first magnetic field having a center at which said electron diffraction image is formed;

a second multipole element for producing a second magnetic field with three-fold symmetry in a location conjugate with said first multipole element; and a doublet lens located between said first and second multipole elements to shift the electron diffraction image formed in the center of said first multipole element to the center of said second multipole element.

4. A transmission electron microscope-comprising:

an illumination optical system for directing an electron beam onto a specimen, said illumination optical system having two illumination lenses that are interlocked to form a crossover point at a first position independent of a current density on said specimen in the immediate vicinity to said specimen and upstream thereof;

an objective lens having a back focal plane and forming a hexapole field comprising a magnetic field whose center is made coincident with the back focal plane of said objective lens, said objective lens forming an electron diffraction image of said specimen at said back focal plane when said crossover point exists at said first position;

a multipole element for producing a magnetic field with three-fold symmetry, said magnetic field having a center-located in a position conjugate with the back focal plane lying in the center of the magnetic field produced by said hexapole field; and a doublet lens located between said hexapole field and said multipole element to shift the electron diffraction image formed at the back focal plane lying in the center of the magnetic field produced by said hexapole field to the center of the magnetic field produced by said multipole element.

* * * * *

UNITED STATES PATENT AND TRADEMARK OFFICE
CERTIFICATE OF CORRECTION

PATENT NO. : 6,555,818 B1
DATED : April 29, 2003
INVENTOR(S) : Fumio Hosokawa

It is certified that error appears in the above-identified patent and that said Letters Patent is hereby corrected as shown below:

<u>Column 7,</u>
Line 29, "$\xi=/3$" should read -- $\xi = \pi/3$ --.

<u>Column 9,</u>
Line 12, "$(r_1-r_{1'Z)\ and\ r1'}$" should read -- $(r_1-r_1'Z)$ and $r_1'$ --.

<u>Column 10,</u>
Line 29, "element is" should read -- element 10 is --.

<u>Column 16,</u>
Line 50, "$k_1r_1^2Z_1N \cos 3\theta_1$" should read -- $k_1r_{-1}^2Z_1N \cos 3\theta_1$ --.

<u>Column 19,</u>
Line 24, "microscope-comprising:" should read -- microscope comprising: --.

Signed and Sealed this

Fourteenth Day of October, 2003

JAMES E. ROGAN
*Director of the United States Patent and Trademark Office*